(12) United States Patent
Suenaga et al.

(10) Patent No.: US 12,431,406 B2
(45) Date of Patent: Sep. 30, 2025

(54) BONDED BODY, CIRCUIT BOARD, SEMICONDUCTOR DEVICE, AND METHOD FOR MANUFACTURING BONDED BODY

(71) Applicants: KABUSHIKI KAISHA TOSHIBA, Tokyo (JP); TOSHIBA MATERIALS CO., LTD., Yokohama (JP)

(72) Inventors: Seiichi Suenaga, Yokohama (JP); Maki Yonetsu, Mitaka (JP); Sachiko Fujisawa, Kawasaki (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 206 days.

(21) Appl. No.: 18/146,626

(22) Filed: Dec. 27, 2022

(65) Prior Publication Data

US 2023/0135530 A1 May 4, 2023

Related U.S. Application Data

(63) Continuation of application No. PCT/JP2021/026928, filed on Jul. 19, 2021.

(30) Foreign Application Priority Data

Jul. 27, 2020 (JP) .................................. 2020-126589

(51) Int. Cl.
*H01L 23/15* (2006.01)
*C04B 37/02* (2006.01)
(Continued)

(52) U.S. Cl.
CPC ........ *H01L 23/3735* (2013.01); *C04B 37/025* (2013.01); *H01L 23/15* (2013.01);
(Continued)

(58) Field of Classification Search
None
See application file for complete search history.

(56) References Cited

U.S. PATENT DOCUMENTS

2017/0003072 A1  1/2017  Holt et al.
2017/0036961 A1  2/2017  Minami et al.
(Continued)

FOREIGN PATENT DOCUMENTS

CN  106255674 A  12/2016
EP  3 031 789 A1  6/2016
(Continued)

OTHER PUBLICATIONS

Combined Chinese Office Action and Search Report issued Aug. 8, 2024 in Chinese Application 202180059558.5, (with unedited computer-generated English translation), 8 pages.
(Continued)

*Primary Examiner* — Daniel J. Schleis
(74) *Attorney, Agent, or Firm* — Oblon, McClelland, Maier &Neustadt, L.L.P.

(57) ABSTRACT

A bonded body according to an embodiment comprises a ceramic substrate, a copper plate, and a bonding layer provided on at least one surface of the ceramic substrate and bonding the ceramic substrate and the copper plate, in which the bonding layer contains Cu, Ti, and a first element being one or two selected from Sn and In, and the bonding layer includes a Ti-rich region in which a ratio ($M_{Ti}/M_{E1}$) of a mass $M_{Ti}$ of Ti to a mass $M_{E1}$ of the first element being 0.5 or more and a Ti-poor region in which the ratio ($M_{Ti}/M_{E1}$) being 0.1 or less.

20 Claims, 3 Drawing Sheets

(51) Int. Cl.
  *H01L 23/373* (2006.01)
  *H05K 1/03* (2006.01)
(52) U.S. Cl.
  CPC ...... *H05K 1/0306* (2013.01); *C04B 2237/366* (2013.01); *C04B 2237/368* (2013.01); *C04B 2237/407* (2013.01)

(56) References Cited

U.S. PATENT DOCUMENTS

| | | |
|---|---|---|
| 2017/0044072 A1 | 2/2017 | Terasaki et al. |
| 2019/0189548 A1 | 6/2019 | Ohashi et al. |
| 2020/0128664 A1 | 4/2020 | Harada et al. |

FOREIGN PATENT DOCUMENTS

| | | | |
|---|---|---|---|
| EP | 3 358 614 | A1 | 8/2018 |
| EP | 3 460 838 | A1 | 3/2019 |
| EP | 3 492 441 | A1 | 6/2019 |
| EP | 4 155 281 | A1 | 3/2023 |
| JP | H0597532 | A * | 4/1993 |
| JP | 2013-211546 | A | 10/2013 |
| JP | 2015-30658 | A | 2/2015 |
| JP | 2015-209356 | A | 11/2015 |
| WO | WO 2015/019602 | A1 | 2/2015 |
| WO | WO 2015/166789 | A1 | 11/2015 |
| WO | WO 2017/200004 | A1 | 11/2017 |
| WO | WO 2018/021472 | A1 | 2/2018 |
| WO | WO 2018/199060 | A1 | 11/2018 |

OTHER PUBLICATIONS

Extended European Search Report issued Jul. 18, 2024 in European Patent Application No. 21850137.7, 8 pages.
International Search Report issued Sep. 21, 2021 in PCT/JP2021/026928 filed on Jul. 19, 2021, 2 pages.

* cited by examiner

BONDED BODY, CIRCUIT BOARD, SEMICONDUCTOR DEVICE, AND METHOD FOR MANUFACTURING BONDED BODY

CROSS-REFERENCE TO RELATED APPLICATIONS

This is a continuation application of International Patent Application PCT/JP2021/026928, filed on Jul. 19, 2021. This application also claims priority to Japanese Patent Application No. 2020-126589, filed on Jul. 27, 2020. The entire contents of which are incorporated herein by reference.

FIELD

Embodiments described below relate to a bonded body, a circuit board, a semiconductor device, and a method for manufacturing a bonded body.

BACKGROUND

A bonded body of a ceramic substrate and a copper plate is used as a circuit board on which a semiconductor element or the like is mounted. International Publication No. 2018/021472 (Patent Literature 1) discloses a ceramic copper circuit board in which the ceramic substrate and the copper plate are bonded. In Patent Literature 1, a brazing material containing Ag, Cu, Ti, etc. is used for a bonding layer. In Patent Literature 1, thermal bonding is performed under a pressure of not less than $1\times10^{-3}$ Pa during the bonding.

Such a pressure of not less than $1\times10^{-3}$ Pa is called a vacuum. A bonding method using Ti is called an active metal bonding method. Because Ti is an active metal, it is easily nitrided or oxidized. In the active metal bonding method, bonding is performed in a vacuum in order to prevent Ti from nitriding or oxidizing before the bonding. For bonding in a vacuum, an interior of a bonding apparatus must be evacuated. Because the temperature is raised after evacuating, only batch processing can be applied to the thermal bonding process. The thermal bonding process includes four processes of vacuuming, heating, bonding, and cooling per batch. It took more than 24 hours per batch. Thus, it cannot be said that the mass productivity is good.

On the other hand, International Publication No. 2018/199060 (Patent Literature 2) discloses performing a thermal bonding process in a continuous-type furnace. In the example of Patent Literature 2, bonding is performed at a furnace length of 3 m and a conveying speed of 10 cm/min. Thermal bonding was completed in about 2 hours including a holding time during the processes.

DETAILED DESCRIPTION

A bonded body according to an embodiment comprises a ceramic substrate, a copper plate, and a bonding layer provided on at least one surface of the ceramic substrate and bonding the ceramic substrate and the copper plate, in which the bonding layer contains Cu, Ti, and a first element being one or two selected from Sn and In, and the bonding layer includes a Ti-rich region in which a ratio ($M_{Ti}/M_{E1}$) of a mass $M_{Ti}$ of Ti to a mass $M_{E1}$ of the first element being 0.5 or more and a Ti-poor region in which the ratio ($M_{Ti}/M_{E1}$) being 0.1 or less.

Figure 1:
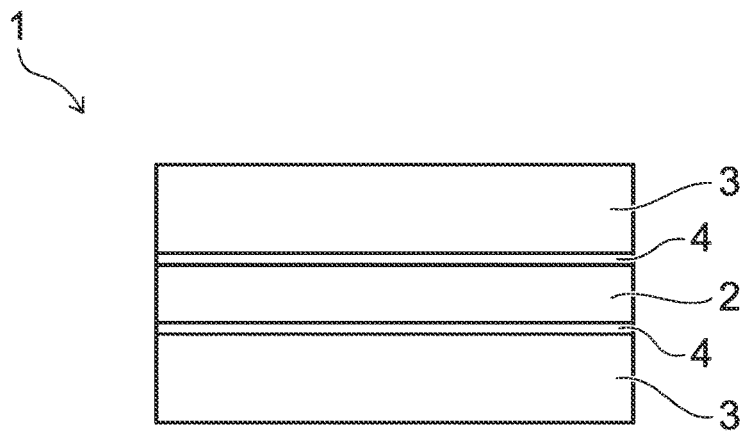
FIG. 1 is a schematic view showing an example of a bonded body according to an embodiment.

FIG. 1 is a schematic view showing an example of a bonded body according to an embodiment. In FIG. 1, 1 is a bonded body, 2 is a ceramic substrate, 3 is a copper plate, and 4 is a bonding layer. FIG. 1 shows the bonded body 1 in which the copper plates 3 are respectively provided on both surface of the ceramic substrate 2 with the bonding layers 4 interposed therebetween. In the example of FIG. 1, the longitudinal and lateral sizes of the ceramic substrate 2 and the copper plate 3 are the same as each other. The bonded body according to the embodiment is not limited to such a form, and may have a structure in which the copper plate 3 is provided only on one surface of the ceramic substrate 2. The longitudinal and lateral sizes of the ceramic substrate 2 and the copper plate 3 may be different from each other.

A silicon nitride substrate, an aluminum nitride substrate, an aluminum oxide substrate, an Alumina zirconia substrate, etc., are examples of the ceramic substrate. It is favorable for the thickness of the ceramic substrate 2 to be not less than 0.1 mm and not more than 1 mm. When the substrate thickness is less than 0.1 mm, there is a possibility that the strength of the ceramic substrate 2 may decrease. Also, when the substrate thickness is greater than 1 mm, there is a possibility that the ceramic substrate may function as a thermal resistor, and the heat dissipation of the bonded body may be degraded.

It is favorable for the three-point bending strength of the silicon nitride substrate to be not less than 600 MPa. Also, it is favorable for the thermal conductivity to be not less than 80 W/m·K. The substrate thickness can be thinned by increasing the strength of the silicon nitride substrate. It is therefore favorable for the three-point bending strength of the silicon nitride substrate to be not less than 600 MPa, and more favorably not less than 700 MPa. Thereby, the substrate thickness of the silicon nitride substrate can be thinned to be not more than 0.40 mm, and even not more than 0.30 mm.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low compared to the silicon nitride substrate, it is favorable for the substrate thickness to be not less than 0.60 mm.

Although the three-point bending strength of the aluminum oxide substrate is about 300 to 450 MPa, the aluminum oxide substrate is inexpensive. Also, although the three-point bending strength of the Alumina zirconia substrate is high, i.e., about 550 MPa, the thermal conductivity of the Alumina zirconia substrate is about 30 to 50 W/m·K.

It is favorable for the ceramic substrate 2 to be one of a silicon nitride substrate or an aluminum nitride substrate. The silicon nitride substrate and the aluminum nitride substrate are nitride ceramic substrates. Nitride ceramics react with an active metal brazing material containing Ti to form titanium nitride. Also, the oxide ceramics react with an active metal brazing material containing Ti to form titanium oxide.

An oxygen-free copper plate or a copper alloy plate can be used as the copper plate 3. It is favorable for the copper plate 3 to be oxygen-free copper. As described in JIS-H-3100, the oxygen-free copper has a copper purity of not less than 99.96 wt %.

The bonding layer contains Cu, Ti, and a first element being one or two selected from Sn and In.

Cu (copper) is an element that serves as a base material of the bonding layer. Even if Cu diffuses into the copper plate, it does not deteriorate the copper plate. Ti (titanium) is an effective element for forming a strong bond by reacting with the ceramic substrate. Sn (tin) or In (indium) is an element effective in lowering the melting point of the bonding brazing material that forms the bonding layer. As will be described later, it is effective to increase the heating rate in order to obtain the desired bonding layer. For that purpose, it is necessary to contain Sn or In.

The bonding layer is characterized by including a Ti-rich region and a Ti-poor region. In the Ti-rich region, the ratio ($M_{Ti}/M_{E1}$) of the mass $M_{Ti}$ of Ti to the mass $M_{E1}$ of the first element is not less than 0.5. In the Ti-poor region, the ratio ($M_{Ti}/M_{E1}$) of the mass $M_{Ti}$ of Ti to the mass $M_{E1}$ of the first element is not more than 0.1. The Ti content in the Ti-rich region is higher than the Ti content in the Ti-poor region.

Figure 2:
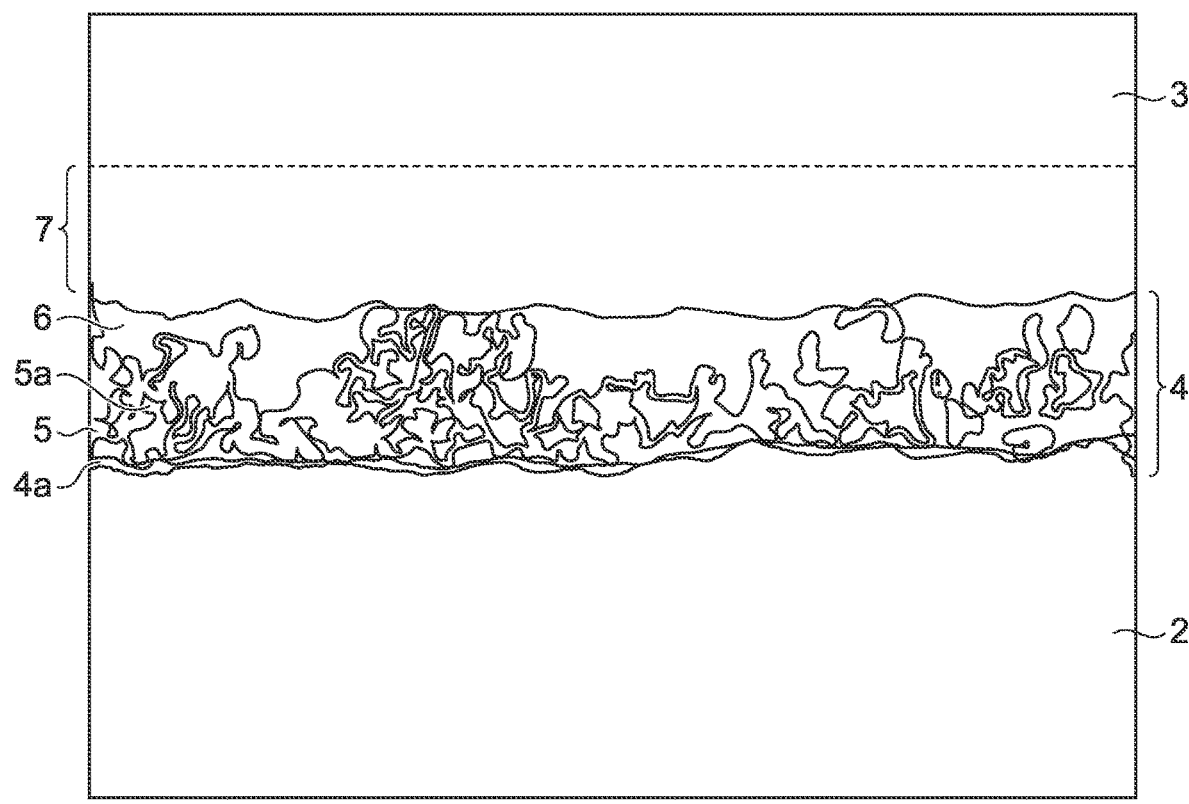
FIG. 2 is a schematic view showing an example of the bonding layer of the bonded body according to the embodiment.

FIG. 2 is a schematic view showing an example of the bonding layer according to the embodiment. In FIG. 2, 2 is the ceramic substrate, 3 is the copper plate, 4 is the bonding layer, 4a is a Ti-aggregate layer, 5 is the Ti-rich region, 5a is a Ti intermediate amount region, 6 is the Ti-poor region, and 7 is a diffusion region. In the bonding layer 4 in FIG. 2, the dotted regions are the Ti-rich region 5 and the Ti intermediate amount region 5a. The dot density of the Ti-rich region 5 is higher than that of the Ti intermediate amount region 5a.

Scanning Electron Microscope-Energy Dispersive X-ray spectroscopy (SEM-EDX) is used to analyze the mass ratio of Ti and the first element. An example in which the first element is Sn will be described below. A cross section of the bonded body 1 is taken as a measurement area. The cross section of the bonded body 1 is parallel to a direction perpendicular to the surface of the ceramic substrate 2. Also, when analyzing the mass ratio of Ti and the first element, only the bonding layer 4 is taken as the measurement area. In other words, the ceramic substrate 2 and the copper plate 3 are not included in the measurement area.

As the SEM, JSM-IT100 manufactured by JEOL or an apparatus having equivalent performance is used. As the EDX, EX-9440IT4L11 manufactured by JEOL or an apparatus having equivalent performance is used. First, by EDX, an area analysis of the measurement area of 20 μm×10 μm is performed. 20 μm of the measurement area is the length in the direction parallel to the surface of the ceramic substrate 2. 10 μm of the measurement area is the length in the direction perpendicular to the surface of the ceramic substrate 2. The reason why the measurement area is set to 20 μm×10 μm is that the range is suitable for examining the distribution of the bonding layer components. When the thickness of the bonding layer 4 is less than 10 μm, "10 μm×the thickness of the bonding layer 4" is set as the measurement area.

The Ti-rich region 5 is a region in which the mass ratio ($M_{Ti}/M_{E1}$) is not less than 0.5. The Ti-poor region 6 is a region in which the mass ratio ($M_{Ti}/M_{E1}$) is not more than 0.1. In the active metal bonding method using Ti, the ceramic substrate 2 is bonded by a reaction between the ceramic substrate 2 and Ti in the brazing material. Therefore, a Ti aggregate layer is formed on the surface of the ceramic substrate 2. For example, when the ceramic substrate 2 is nitride ceramics, the Ti-aggregate layer will be a titanium nitride (TiN) layer. When the ceramic substrate 2 is an oxide ceramic substrate, the Ti aggregate layer will be a titanium oxide ($TiO_2$) layer.

Although the mass ratio ($M_{Ti}/M_{E1}$) in the Ti-rich region is not particularly limited, it is preferably not more than 1.2. When the mass ratio ($M_{Ti}/M_{E1}$) exceeds 1.2, it means that either the amount of Ti is large or the amount of Sn (or In) is small. In such a case, there is a possibility that the bondability will deteriorate when the heating rate is increased. Therefore, the mass ratio ($M_{Ti}/M_{E1}$) in the Ti-rich region is preferably not less than 0.5 and not more than 1.2.

The existence of Ti-rich region 5 can suppress excessive diffusion of Sn (or In) into the copper plate. In other words, Ti has a trapping effect of retaining Sn in the bonding layer 4.

The mass ratio ($M_{Ti}/M_{E1}$) in the Ti-poor region 6 is not more than 0.1. By providing both the Ti-rich region 5 and the Ti-poor region 6 in the bonding layer 4, both the effect of suppressing the diffusion of Sn into the copper plate and the effect of improving bondability can be achieved. The lower limit of the mass ratio ($M_{Ti}/M_{E1}$) in the Ti-poor region 6 includes zero. The Ti amount of zero means that the amount is below the detection limit.

A TiSn alloy exists in a portion of the Ti-rich region 5. The TiSn alloy may exist in a portion of the Ti-poor region 6. The main component of the Ti-aggregate layer 4a is titanium nitride or titanium oxide, as will be described later. The Ti-rich region and the Ti-poor region are distinguished from the Ti aggregate layer formed on the surface of the ceramic substrate 2. Also, a region in which the mass ratio ($M_{Ti}/M_{E1}$) is not less than 0.2 and not more than 0.4 may exist in the measurement area. The region where the mass ratio ($M_{Ti}/M_{E1}$) is not less than 0.2 and not more than 0.4 is called the Ti intermediate amount region. The TiSn alloy in the Ti-rich region 5 and the Ti-poor region 6 may also contain intermetallic compounds. $Sn_3Ti_5$ and $Sn_5Ti_6$ are examples of the intermetallic compounds. Not less than 50% of the TiSn alloy is preferably $Sn_3Ti_5$ or $Sn_5Ti_6$. The existence of $Sn_3Ti_5$ or $Sn_5Ti_6$ indicates that the bonding reaction successfully occurred.

The ratio ($M_{Cu}/M_{E1}$) of the mass $M_{Cu}$ of Cu to the mass $M_{E1}$ of the first element is preferably not less than 0.05 and not more than 0.4. In the Ti-poor region 6, the mass ratio ($M_{Cu}/M_{E1}$) is preferably not less than 3 and not more than 10. By providing Cu in the Ti-rich region 5 and the Ti-poor region 6, the melting point of the bonding layer 4 can be lowered. When the melting point of the bonding layer 4 is lowered, the bondability can be improved even if the heating time is shortened, as will be described later. Intermetallic compounds such as CuSn, CuIn, CuSnTi, and CuInTi may exist in the Ti-rich region 5 and the Ti-poor region 6.

The Ti-rich region described above is mainly composed of a TiSn alloy that contains a large amount of Sn having a large atomic number. When a cross section of the bonding layer is observed with a backscattered electron image of SEM, an element with a large atomic number appears whiter than an element with a small atomic number. Therefore, the TiSn alloy appears white when the backscattered electron image of SEM is observed with high contrast. The amount of TiSn alloy in the Ti-rich region is significantly higher than the amount of TiSn alloy in the Ti-poor region. In other words, in the bonding layer observed in the backscattered electron image, a region that appears white can be regarded as the Ti-rich region. It is preferable that the area observed white with high contrast exists in an area ratio of not less than 10% per the measurement area of 20 μm×10 μm. Also, by observing the backscattered electron image, the area ratio of the Ti-rich region can be obtained. The upper limit of the area ratio of the region that appears white is preferably 90%. Both the Ti-rich region 5 and the Ti-poor region 6 must exist within the measurement area of 20 μm×10 μm. Also, the area ratio of the Ti-rich region may be obtained in combination with the above-described SEM-EDX. As the atomic number of the element increases, the contrast in the backscattered electron image of the SEM appears whiter. When the mass ratio ($M_{Ti}/M_{E1}$) in the Ti-rich region is not less than 0.5 and not more than 1.2, it becomes easy to distinguish between the Ti-rich region and the Ti-poor region by the contrast. The contrast of the backscattered electron image of the SEM can be changed depending on the apparatus. For this reason, it is effective to check by the shade of white. Therefore, the method using the backscattered electron image can be used as a simplified way of the method using the EDX.

The area ratio of the Ti-rich region is preferably in the range not less than 10% and not more than 90%, more preferably not less than 20% and not more than 60%. In addition to the Ti-rich region, the bonding layer comprises the Ti-poor region or the Ti intermediate amount region. Also, the area ratio of the Ti-poor region is preferably in the range not less than 10% and not more than 50%. Also, in the measurement area of 20 μm×10 μm, regions other than the Ti-rich region, the Ti intermediate amount region, and the Ti-poor region may exist. For example, when a Cu—Sn—Ti—C based brazing material is used, a Sn-free region may be formed. The Sn-free region does not correspond to any of the Ti-rich region, the Ti intermediate amount region, and the Ti-poor region. Therefore, when the Ti-rich region, the Ti intermediate amount region, and the Ti-poor region satisfy the above-described ranges, a region in which Sn or In does not exist may be provided.

When a cross section of the bonding layer is divided vertically into two halves, the mass ratio ($M_T/M_{E1}$) in the area on the ceramic substrate side is preferably greater than the mass ratio ($M_{Ti}/M_{E1}$) in the area on the copper plate side. For example, the ratio ($M_{Ti}/M_{Sn}$) of the mass $M_{Ti}$ of Ti to the mass $M_{Sn}$ of Sn is preferably less than 1 when the cross section of the bonding layer is analyzed. Further, when a surface analysis is performed for the cross section of the bonding layer, the ratio ($M_{Ti}/M_{In}$) of the mass $M_{Ti}$ of Ti to the mass $M_{In}$ of In is preferably less than 1.

Dividing the cross section of the bonding layer vertically into two halves means that a straight line perpendicular to the surface of the ceramic substrate is drawn from the bonding boundary between the ceramic substrate and the bonding layer to the bonding boundary between the bonding layer and the copper plate and another straight line parallel to the ceramic substrate surface is drawn from the center of the straight line. The bonding boundary between the ceramic substrate 2 and the bonding layer 4 is the bonding boundary between the ceramic substrate 2 and the Ti-aggregate layer 4a. When the ceramic substrate 2 is a nitride-based ceramic substrate, the Ti-aggregate layer is a titanium nitride (TiN) layer. The bonding boundary between the bonding layer 4 and the copper plate 3 is the farthest point (the farthest point from the ceramic substrate 2) of the points where the components of the bonding layer are continuous and contact the copper plate 3. Because the components of the bonding layer 4 contain Ti and the first element, the bonding boundary between the bonding layer 4 and the copper plate 3 is determined based on the diffusion state of these elements. The titanium nitride, which is the Ti-aggregate layer, may contain titanium and nitrogen at an atomic ratio other than 1:1.

When the ceramic substrate is oxide-based ceramics, the Ti-aggregate layer is titanium oxide. Various titanium oxides such as $TiO_2$, TiO, and $Ti_2O_3$ may exist as the Ti-aggregate layer. When the oxide-based ceramic substrate is used, the bonding boundary is determined by replacing the aforementioned titanium nitride with titanium oxide.

When the cross section of the bonding layer is vertically divided into two halves, the mass ratio ($M_T/M_{E1}$) in the region on the ceramic substrate side being greater than the mass ratio ($M_{Ti}/M_{E1}$) in the region on the copper plate side means that the amount of Ti is small or the amount of the first element is large in the region of the bonding layer on the copper plate side. Also, when the cross section of the bonding layer is analyzed, the mass ratio ($M_{Ti}/M_{Sn}$) being less than 1 indicates that the amount of Sn is greater than the amount of Ti in the bonding layer. Similarly, when the cross section of the bonding layer is analyzed, the mass ratio ($M_{Ti}/M_{In}$) being less than 1 indicates that the amount of In is greater than the amount of Ti in the bonding layer.

By controlling the distribution of Ti and the first element, diffusion of the first element into the copper plate can be suppressed. Therefore, the melting point of the copper plate is suppressed from lowering, and deformation of the copper plate during bonding can be suppressed. As a result, it is possible to reduce the warp of the bonded body during bonding.

The height of the diffusion region is preferably not less than 100 μm. In the diffusion region, the diffusion amount of Sn or In from the boundary between the bonding layer and the copper plate to the copper plate is not less than 1 wt % The height of the diffusion region corresponds to the distance from the boundary between the bonding layer and the copper plate to the boundary between the region where the diffusion amount of Sn or In is not less than 1 wt % and the region where the diffusion amount of Sn or In is less than 1 wt % in the copper plate. More preferably, the height of the diffusion region is not more than 50 μm.

A melting point of a CuSn alloy decreases as the amount of Sn increases. When Sn diffuses into the copper plate, the CuSn alloy is formed in the copper plate. When the amount of Sn diffusion is large, the amount of Sn in the CuSn alloy increases. As a result, the melting point of the copper plate is lowered, and the copper plate is likely to be distorted during the bonding process and the TCT test. Generally, the melting point of copper is 1085° C. When the amount of Sn in the CuSn alloy is not less than 50 wt %, the melting point of the CuSn alloy is 100 to 300° C. When the amount of Sn diffusing into the copper plate is small, there is no effect, but when the amount of Sn diffusing increases, there is an effect. Therefore, the height of the diffusion region 7 where the amount of Sn or In diffused into the copper plate 3 is not less than 1 wt % is preferably not more than 100 μm, more preferably not more than 50 μm.

When the oxygen-free copper plate is used as the copper plate, the content of Sn or In in the copper plate can be regarded as the diffusion amount of Sn or In. The copper alloy plate containing Sn or In may be used as the copper plate. Sn or In is uniformly dispersed in the copper alloy plate. Thus, the content of Sn or In on the front surface side of the copper plate (so-called the surface of the copper plate) and the content on the back surface side of the copper plate (diffusion region 7) are measured, and the content on the front surface side is subtracted from the content on the back surface side to calculate the amount of diffusion. The back surface of the copper plate is the surface to be bonded with the ceramic substrate. The front surface is the surface opposite to the back surface and is not in contact with the bonding layer. Even when the copper alloy plate is used, the diffusion of Sn or In lowers the melting point of the copper alloy plate, so it is preferable to suppress the diffusion of Sn or In. Note that the melting point of the copper alloy plate containing Sn or In is lower than the melting point of the oxygen-free copper plate containing no Sn or In. Therefore, the oxygen-free copper plate is preferably for the copper plate.

It is preferable that the thickness of the copper plate is not less than 0.3 mm. When the copper plate 3 is thick, it is possible to improve the current-carrying capacity and heat dissipation. Therefore, the thickness of the copper plate 3 is preferably not less than 0.3 mm, more preferably not less than 0.6 mm. Because the bonded body according to the embodiment can narrow the diffusion region 7 in which Sn or In is diffused into the copper plate, it is possible to suppress distortion even if the copper plate is thick.

Although the upper limit of the thickness of the copper plate 3 is not particularly limited, it is preferably not more than 3 mm, more preferably not more than 2 mm. Bonding is possible even if the thickness of the copper plate exceeds 3 mm. On the other hand, when the copper plate is too thick, the etching process is difficult. The etching process is performed to provide a pattern configuration to the copper plate. Therefore, the thickness of the copper plate is preferably not less than 0.3 mm and not more than 3 mm.

The bonding layer 4 may contain elements other than Cu, Ti, Sn, and In. Examples of the elements other than these are not more than 20 wt % of Ag or not more than 2 wt % of carbon.

The bonded body as described above is suitable for a circuit board. Also, a semiconductor element can be mounted on the circuit board according to the embodiment, and the circuit board can be used for a semiconductor device.

Figure 3:
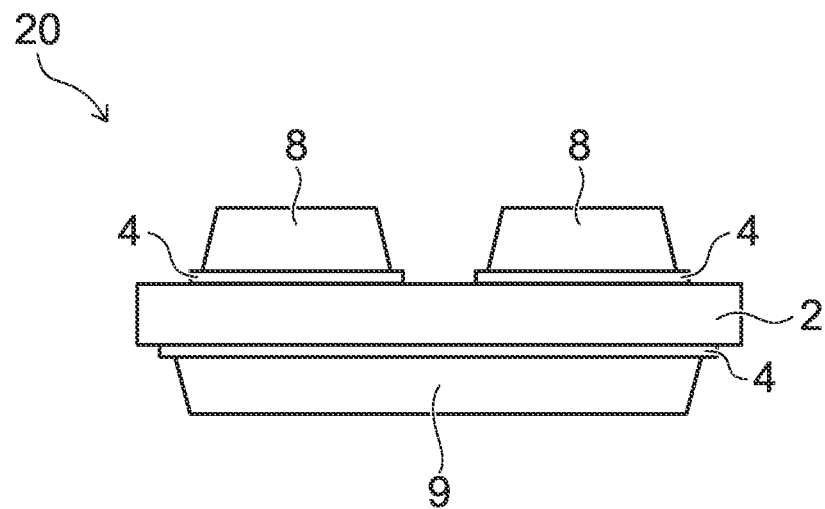
FIG. 3 is a schematic view showing an example of the circuit board according to the embodiment.
Figure 4:
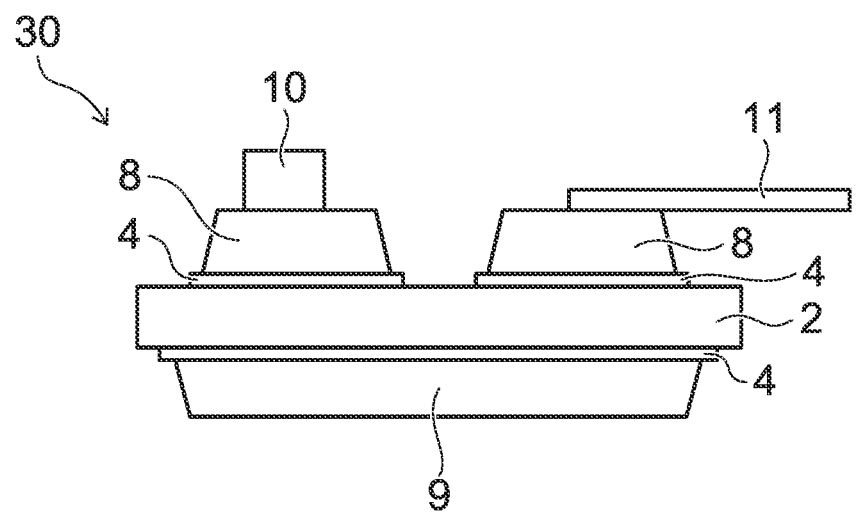
FIG. 4 is a schematic view showing an example of a semiconductor device according to the embodiment.

FIG. 3 is a schematic view showing an example of the circuit board according to the embodiment. FIG. 4 is a schematic view showing an example of the semiconductor device according to the embodiment. In FIG. 3 and FIG. 4, 8 is a copper circuit portion, 9 is a heat dissipation plate, 10 is a semiconductor element, 11 is a lead frame, 20 is a circuit board, and 30 is a semiconductor device.

In the circuit board 20 shown in FIG. 3, the copper plate 3 on the front side of the bonded body 1 is processed into the copper circuit portion 8, and the copper plate 3 on the back side is processed into the heat dissipation plate 9. The circuit board 20 is made by providing the circuit configuration to the copper plate 3 of the bonded body 1. In the semiconductor device 30 shown in FIG. 4, the semiconductor element 10 is mounted on the copper circuit portion 8 of the circuit board 20. In addition to the semiconductor element 10, the lead frame 11 or the like may be mounted as necessary in the semiconductor device 30. In the example shown in FIG. 3, the circuit board 20 has a structure in which two copper circuit portions 8 are provided, but the structure of the circuit board 20 is not limited to this example. The number or the sizes of the copper circuit portions 8 can be changed as required. The respective numbers of semiconductor elements 10 and lead frames 11 can also be changed arbitrarily. Also, the copper plate 3 on the back side is used as the heat dissipation plate 9 in FIG. 3, but the copper plates 3 on both sides may be provided with circuit configurations.

If necessary, the side surface of the copper circuit portion 8 and the side surface of the heat dissipation plate 9 may be inclined. If necessary, the bonding layer 4. may be provided with a jutting portion that juts from the side edge of the copper circuit portion 8 or the side edge of the heat dissipation plate 9. It is preferable to use an etching process to provide the circuit configuration and to provide the inclined shape of the side surface of the copper plate.

Next, a method for manufacturing a bonded body according to the embodiment will be described. The manufacturing method is not limited, as long as the bonded body according to the embodiment has the above structure. Here, an example of a method for obtaining the bonded body according to the embodiment with a high yield will be described.

First, the ceramic substrate 2 is prepared. A silicon nitride substrate, an aluminum nitride substrate, an aluminum oxide substrate, an Alumina zirconia substrate, etc., are examples of the ceramic substrate 2. The Alumina zirconia substrate is a substrate in which aluminum oxide and zirconium oxide are mixed.

The oxygen-free copper plate or the copper alloy plate can be used for the copper plate 3. The copper plate is preferably the oxygen-free copper. The oxygen-free copper is a copper plate having a copper purity of not less than 99.96 wt %, as specified in JIS-H-3100 (ISO1337, etc.).

Next, the bonding brazing material is prepared. The bonding brazing material preferably contains not less than 50 mass % of Cu, not less than 4 mass % and not more than 30 mass % of Ti, not less than 5 mass % and not more than 40 mass % of one or two selected from Sn and In, not less than 0 mass % and not more than 20 mass % of Ag, not less than 0 mass % and not more than 2 mass % of Carbon.

Also, the bonding brazing material is prepared so that it can be bonded even if a rapid heating process with a heating rate of not less than 20° C./min is performed.

It is preferable that the bonding brazing material has an endothermic peak in the range of not less than 520° C. and not more than 590° C. in the DSC curve of the heating process at the heating rate of 20° C./min.

The DSC curve is obtained by applying heat to a sample and measuring the existence or absence of endothermic reaction and exothermic reaction using a Differential Scanning Calorimeter (DSC). When the endothermic reaction or the exothermic reaction occurs, a peak appears in the DSC curve. A peak in the negative direction is the endothermic reaction, and a peak in the positive direction is the exothermic reaction. The endothermic reaction indicates that the sample is melting, decomposing, etc. The exothermic reaction indicates that the constituent elements of the sample react with each other to form or solidify a compound (including alloying). Larger peak indicates larger heat of the reaction. Here, the peak in the negative direction is called an endothermic peak, and the peak in the positive direction is called an exothermic peak. Also, the apex of the peak is called a peak top. The difference between the local maximum point and the local minimum point of the peak is called a peak height.

For example, the endothermic peak is in the negative direction, so it goes up, then down, then up. The endothermic peak includes a change of a local maximum point→a local minimum point→a local maximum point. The local minimum point (the lowest point) is the peak top. Of the local maximum points on the low-temperature and high-temperature sides of the local minimum point, the larger value (larger peak in the positive direction) is taken as the top maximal point. The peak height is the value obtained by subtracting the local minimum point from the top maximal point.

For example, the exothermic peak is in the positive direction, so it goes down, then up, then down. The exothermic peak includes a change of a local minimum point→a local maximum point→a local minimum point. The local maximum point (the highest point) is the peak top. Of the local minimum points on the low-temperature and high-temperature sides of the local maximum point, the smaller value (larger peak in the negative direction) is taken as a bottom minimal point. The peak height is the value obtained by subtracting the bottom minimal point from the local maximum point.

The end point of the endothermic peak (peak in the negative direction) may appear as the exothermic peak (peak in the positive direction), but it is counted as the exothermic peak here. Each peak may be obtained by drawing a baseline.

As the DSC, TGA-DSC simultaneous thermal analysis device STA449-F3-Jupiter manufactured by NETZSCH or a device having equivalent performance is used. Also, the measurement is carried out in an Ar (argon) flow by dropping an appropriate amount of brazing material into an alumina container. The measurement is carried out with the lid of the alumina container closed. It is necessary to prevent the brazing material from reacting with the atmosphere by measuring in the Ar atmosphere. In addition, the amount (mg) dropped is measured with a balance. Not less than 15 mg of the solid content of the sample is prepared.

A temperature profile for obtaining the DSC curve consists of the heating process described above, a holding process, and a cooling process. The heating process is a process of raising the temperature from room temperature to 950° C. at the heating rate of 20° C./min. The holding process is a process of holding at 950° C. for 20 minutes. The cooling process is a process of lowering the temperature from 950° C. to room temperature at a cooling rate of 20° C./min. The holding process is performed after the heating process, and the cooling process is performed after the holding process. Hereinafter, the DSC curve of the heating process with the heating rate of 20° C./min may be referred to as the DSC curve of the heating process. The DSC curve of the cooling process with the cooling rate of 20° C./min may be referred to as the DSC curve of the cooling process. In the DSC curve, a difference in heat flow of not less than 0.02 mW/mg between the baseline and the apex of a protrusion was counted as a peak.

Figure 5:
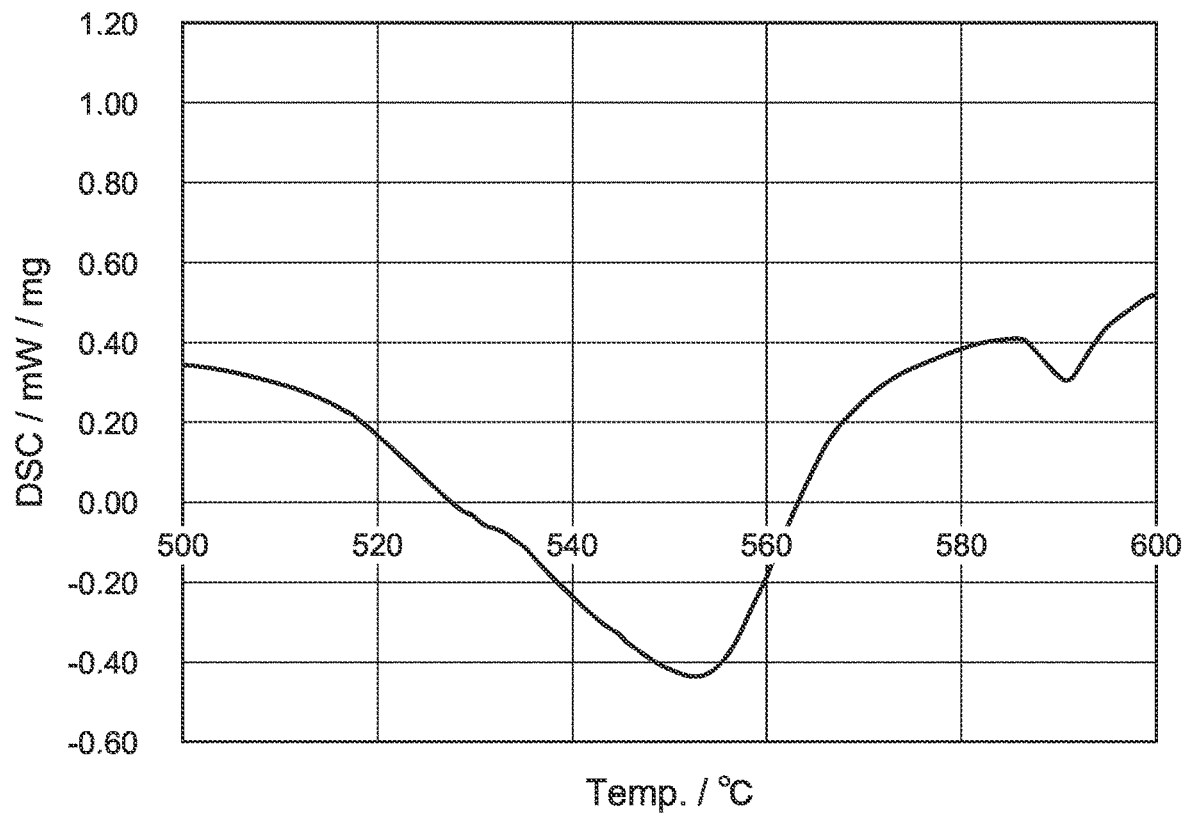
FIG. 5 is a DSC curve (500 to 600° C.) of a heating process of a bonding brazing material used in an example 1.
Figure 6:
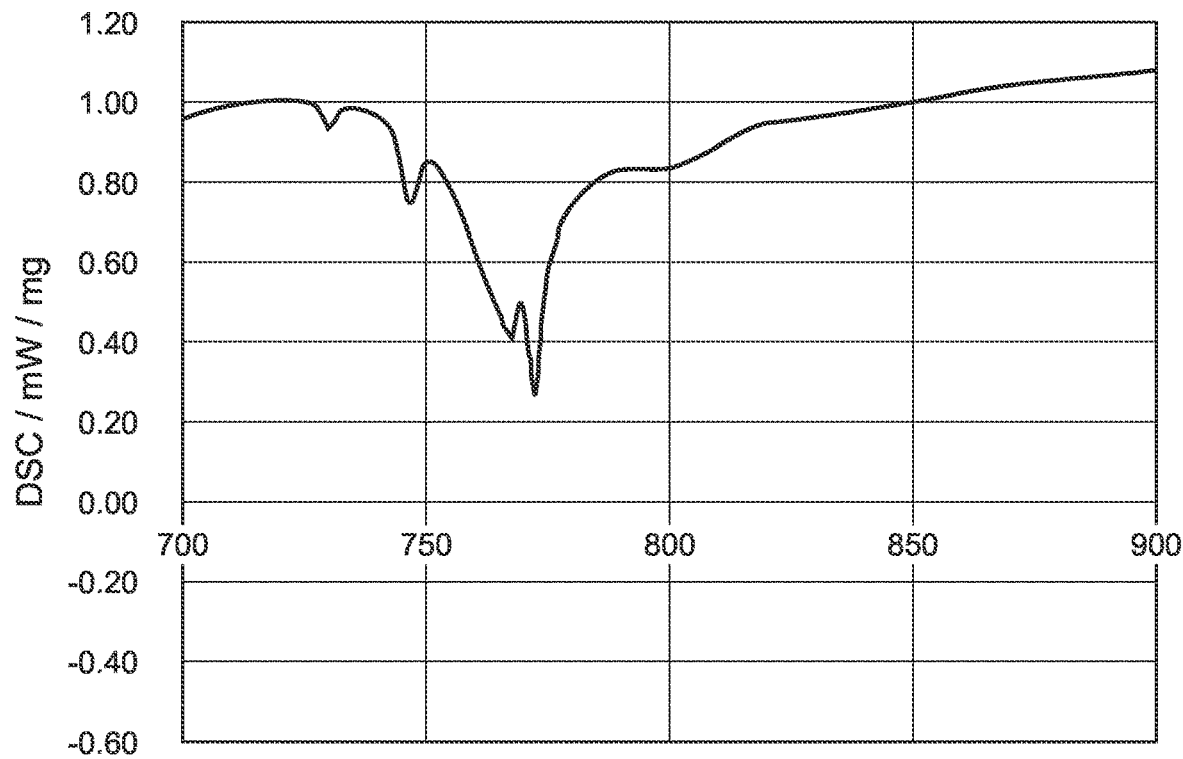
FIG. 6 is a DSC curve (700 to 900° C.) of the heating process of the bonding brazing material used in the example 1.

FIG. 5 shows the DSC curve (500 to 600° C.) of the heating process of the bonding brazing material used in an example 1, and FIG. 6 shows the DSC curve (700 to 900° C.) of the heating process of the bonding brazing material used in the example 1. In FIG. 5 and FIG. 6, the horizontal axis represents temperature (° C.) and the vertical axis represents heat flow (mW/mg). In FIG. 5 and FIG. 6, the heat flow is denoted as DSC.

It is preferable that the DSC curve of the heating process at the heating rate of 20° C./min has an endothermic peak in the range of not less than 520° C. and not more than 590° C. Moreover, it is preferable to have an endothermic peak within the range of not less than 730° C. to 800° C. of the heating process. The endothermic peak within the range of not less than 520° C. and not more than 590° C. in the DSC curve of the heating process is called a first endothermic peak. When there are two or more endothermic peaks in the range of not less than 520° C. and not more than 590° C. in the DSC curve of the heating process, the largest peak is taken as the first endothermic peak. The largest peak indicates a large peak on the minus side. Also, the endothermic peak within the range of not less than 730° C. to 900° C. in the DSC curve of the heating process is called a second endothermic peak. When there are two or more endothermic peaks within the range of not less than 730° C. to 900° C. in the DSC curve of the heating process, the largest peak is taken as the second endothermic peak. The largest peak indicates a large peak on the minus side. FIG. 5 is a chart showing an example of the first endothermic peak. FIG. 6 is a chart showing an example of the second endothermic peak. The brazing material containing no Ag preferably has the second endothermic peak within the range of not less than 730° C. and not more than 800° C. as shown in FIG. 6.

The first endothermic peak indicates the decomposition reaction of $TiH_2$. The decomposed hydrogen has the effect of removing impurity oxygen in the brazing material and activating metal components. AgCuSnTi brazing material containing not less than 40 mass % of Ag is used as a conventional active metal brazing material. In the conventional active metal brazing material, the decomposition reaction of $TiH_2$ occurs at 480-500° C. In other words, there is no first endothermic peak in the DSC curve of the conventional active metal brazing material. By shifting the decomposition reaction of $TiH_2$ to the high-temperature side, the nitriding of the bonding brazing material can be suppressed. When the nitride-based ceramic substrate and the copper plate are bonded using the active metal brazing material, the Ti-aggregate layer is formed on the surface of the ceramic substrate. By shifting the decomposition reaction of $TiH_2$ to the high-temperature side, it is possible to suppress nitriding of Ti in the brazing material before it reacts with the ceramic substrate. Therefore, bonding can be performed in the nitrogen atmosphere.

The second endothermic peak indicates the melting reaction between Cu and the first element. Cu and the first element are elements that form the base material of the bonding brazing material. Therefore, the second endothermic peak indicates that the reaction occurs in which the bonding brazing material melts and a liquid phase is generated. For conventional active metal brazing material, the decomposition reaction of $TiH_2$ occurs at 480-500° C. That is, there is no first endothermic peak in the conventional active metal brazing material. The temperature difference between the peak indicating the decomposition reaction of $TiH_2$ and the second endothermic peak indicating the melting reaction between Cu and the first element can be reduced by using the bonding brazing material that occurs the first endothermic peak. As a result, the bondability can be maintained even if the heating rate in the bonding process is increased.

It is preferable that the DSC curve of the cooling process at the cooling rate of 20° C./min has an exothermic peak. The exothermic peak in the cooling process indicates that the formation or solidification of a compound (an alloy) in the bonding layer occurs. The thermal stress is greatest when the molten brazing material solidifies. This is because members having different coefficients of thermal expansion are constrained after the bonding boundary is formed, and the stress is generated during cooling due to the difference in the thermal expansion. Therefore, it is preferable that the DSC curve in the cooling process has the exothermic peak at not more than 850° C. The DSC curve may have two or more exothermic peaks. Having two or more exothermic peaks indicates that the formation or the solidification of the compound (alloy) in the bonding layer is performed in multiple steps. This improves the stress relaxation effect of the bonded body.

Moreover, it is preferable that the DSC curve of the cooling process at the cooling rate of 20° C./min has an exothermic peak at not less than 450° C. and not more than 550° C. The exothermic peak at not less than 450° C. and not more than 550° C. in the DSC curve of the cooling process at the cooling rate of 20° C./min is called a first exothermic peak. When there are two or more exothermic peaks in the temperature range, the largest peak is taken as the first exothermic peak. When the exothermic peak in the cooling process is less than 450° C., the solidification temperature is too low, and there is a possibility that the reliability of the bonding will decrease. On the other hand, when the exothermic peak is high, i.e., greater than 550° C., the thermal stress may increase.

Also, when comparing the peak top temperatures of the first endothermic peak of the heating process and the first exothermic peak of the cooling process, the peak top temperature of the first exothermic peak is preferably lower. The first endothermic peak is mainly caused by the decomposition reaction of $TiH_2$. On the other hand, the first exothermic peak in the cooling process is an exothermic reaction caused by solidification of the bonding layer or formation of Ti compounds. By setting the position of the peak top of the first exothermic peak in the cooling process to a temperature lower than the position of the peak top of the first endothermic peak in the heating process, it is possible to suppress the generation of thermal stress in the cooling process. As long as the cooling process has the exothermic peak, the first exothermic peak may not be present. Also, a similar effect can be obtained by having two or more exothermic peaks in the DSC curve of the cooling process.

Such bonding brazing material can be bonded at the heating rate of not less than 20° C./min or at the cooling rate of not less than 20° C./min. Also, the bonding atmosphere may be in a vacuum or in a nitrogen atmosphere. Note that the vacuum means an atmosphere of not more than $1 \times 10^{-3}$ Pa. Also, the nitrogen atmosphere means an atmosphere containing not less than 70 vol % of nitrogen. Argon gas or air atmosphere is an example of a component other than nitrogen.

Controlling the composition of the brazing material is effective in controlling the DSC curve. The bonding brazing material preferably contains not less than 50 mass % of Cu, not less than 4 mass % and not more than 30 mass % of Ti, not less than 5 mass % and not more than 40 mass % of one or two selected from Sn and In, not less than 0 mass % and not more than 20 mass % of Ag, not less than 0 mass % and not more than 2 mass % of Carbon.

The total content of Cu, Ti, and the first element is preferably not less than 80 mass %, more preferably not less than 90 mass % and not more than 100 mass %. Also, the total content of Cu and the first element is preferably not less than 70 mass %. The melting point of the brazing material can be raised by substantially lowering the content proportion of Ag. This makes it possible to obtain the brazing material having the desired DSC curve even if the heating rate and cooling rate are increased.

About Cu powder used as the raw material of the brazing material, the average grain size $D_{50}$ is preferably not more than 12.0 μm, more preferably not more than 10.0 μm. The average grain size $D_{50}$ of $TiH_2$ powder is preferably not more than 6.0 μm, more preferably not more than 4.0 μm. The average grain size $D_{50}$ of Sn powder or In powder is preferably not more than 16.0 μm, more preferably not more than 14.0 μm. The average grain size $D_{50}$ of C powder is preferably not more than 6.0 μm, more preferably not more than 4.0 μm. The average grain size $D_{50}$ of Ag powder is preferably not more than 3.0 μm, more preferably not more than 2.0 μm. By controlling the grain size of the powder, the reaction of each powder can be made uniform.

The average grain size $D_{50}$ of the Cu powder is preferably smaller than the average grain size $D_{50}$ of the Sn powder or In powder. As described above, Cu and the first element are the base materials for the brazing material composition. Sn and In are elements having lower melting points compared with Cu. By increasing the grain size of Sn or In, the reaction between Sn powder and Cu powder or the reaction between In powder and Cu powder can be homogenized. As a result, it can be bonded even if the heating rate or the cooling rate is increased.

Moreover, it is preferable that the difference between the heating rate and the cooling rate is not more than 20° C./min. That is, it is preferable to satisfy |heating rate-cooling rate|≤20° C./min. By heating the brazing material layer, the melting reaction and the solidification reaction occur. These reactions occur in the heating process and the cooling process. By reducing the difference between the heating rate and the cooling rate, the stress caused by the reactions can be homogenized. Thereby, problems such as the warp can be suppressed. It is also effective in controlling the area ratios of the Ti-rich region, the Ti-poor region, and the Ti intermediate amount region.

A process of bonding the ceramic substrate and the copper plate is performed using the brazing material as described above. A brazing material paste is prepared by mixing a bonding brazing material with an organic substance. The brazing material paste is applied to the surface of the ceramic substrate 2 (or the copper plate 3) to form a brazing material paste layer. The copper plate 3 (or the ceramic substrate 2) is placed on the brazing material paste layer.

The thermal bonding process is performed in vacuum or in the nitrogen atmosphere. In vacuum means under pressure of not more than $1 \times 10^{-3}$ Pa. The nitrogen atmosphere is an atmosphere containing not less than 70 vol % of nitrogen. The nitrogen atmosphere preferably has a nitrogen content of not less than 70 vol %, more preferably not less than 85 vol % and not more than 100 vol %. The nitrogen atmosphere may contain argon gas or the atmosphere in addition to nitrogen. When the thermal bonding is performed in a nitrogen atmosphere, it can be performed under a various condition such as normal pressure, reduced pressure, or increased pressure.

In the heating process of the thermal bonding process, the heating rate is set to not less than 20° C./min. In the conventional active metal bonding method, the heating rate was not more than 5° C./min. By using the brazing material having the DSC curve as described above, it is possible to bond even if the heating rate is increased. Although the upper limit of the heating rate is not particularly limited, it is preferably not more than 100° C./min. When the heating rate is high, i.e., greater than 100° C./min, the bondability may deteriorate. Therefore, the heating rate is preferably not less than 20° C./min and not more than 100° C./min, more preferably not less than 30° C./min and not more than 70° C./min.

The temperature is raised to the bonding temperature by the heating process. The bonding temperature is set to not less than 750° C. Also, the bonding temperature is set to a temperature higher than the peak top temperature of the second endothermic peak. The second endothermic peak is at 730-800° C. By setting the bonding temperature to a temperature higher than the peak top temperature of the second endothermic peak, the melting reaction of the brazing material can be caused properly. Therefore, the bonding temperature is preferably not less than 750° C., more preferably not less than 800° C. The upper limit of the bonding temperature is preferably not more than 1000° C. When the temperature is high, i.e., greater than 1000° C., the temperature is close to the melting point of copper (1085° C.), and the copper plate may be deformed.

The bonding temperature is preferably held for not less than 10 minutes. The time during which the bonding temperature is held is referred to as a heat-holding time. The heat-holding time is preferably not less than 10 minutes and not more than 100 minutes. When the heat-holding time is less than 10 minutes, there is a possibility that the brazing material will not have enough time to melt or solidify. Also, when it is longer than 100 minutes, Sn or In may diffuse too much into the copper plate.

After the heat-holding time has ended, the cooling process is performed. The cooling process is a process of cooling from the bonding temperature to room temperature. The cooling rate is set to not less than 20° C./min. In the conventional active metal bonding method, the cooling rate was about 5° C./min. By using the brazing material having the DSC curve as described above, it is possible to bond even if the cooling rate is increased. Although the upper limit of the cooling rate is not particularly limited, it is preferably not more than 100° C./min. When it is high, i.e., greater than 100° C./min, the bondability may deteriorate. Therefore, the cooling rate is preferably not less than 20° C./min and not more than 100° C./min, more preferably not less than 30° C./min and not more than 70° C./min.

Further, if necessary, the thermal bonding process may be performed while placing a weight on the bonded body 1.

Through the bonding process as described above, the bonded body 1 can be made. By increasing the heating rate in the heating process and the cooling rate in the cooling process, the amount of heat applied to the bonded body 1 can be reduced. As a result, the distribution of Ti and the first element in the bonding layer can be controlled. Also, the amount of Sn (or In) diffused into the copper plate can be reduced.

Because the amount of heat applied to the bonded body 1 can be reduced, warp of the bonded body 1 or distortion of the copper plate 3 can be reduced.

The obtained bonded body 1 is etched and processed into the circuit board 20. Multiple components can be obtained as needed. Obtaining multiple components is a method of obtaining small bonded bodies by cutting a large bonded body. There is also a method of subdividing the bonded body or a method of subdividing the ceramic circuit board. Scribing may be performed to easily subdivide. Scribing may be performed to easily subdivide.

EXAMPLES

Examples 1 to 5, comparative example 1, reference examples 1 to 2

Bonding brazing materials shown in Table 1 and Table 2 were prepared. Table 1 shows the grain sizes of the raw material powders and Table 2 shows the composition ratio.

TABLE 1

| | Average grain size $D_{50}$ (μm) | | | | |
|---|---|---|---|---|---|
| | Cu powder | Sn powder | $TiH_2$ powder | C powder | Ag powder |
| Example 1 | 8.5 | 12.2 | 2.0 | — | — |
| Example 2 | 7.5 | 11.3 | 1.8 | 0.8 | — |
| Example 3 | 6.8 | 10.3 | 1.7 | 1.6 | — |
| Example 4 | 9.2 | 13.1 | 2.1 | — | — |
| Example 5 | 8.2 | 14.2 | 1.8 | 1.1 | — |
| Comparative example 1 | 8.9 | 12.7 | 3.2 | — | 2.8 |

TABLE 2

| | Composition ratio (mass %) | | | | |
|---|---|---|---|---|---|
| | Cu powder | Sn powder | $TiH_2$ powder | C powder | Ag powder |
| Example 1 | 59.3 | 30 | 10 | 0.7 | — |
| Example 2 | 71.8 | 21 | 7 | 0.2 | — |
| Example 3 | 73 | 15 | 12 | — | — |
| Example 4 | 60 | 32 | 8 | — | — |
| Example 5 | 62.9 | 28 | 9 | 0.1 | — |
| Comparative example 1 | 42 | 5 | 3 | — | 50 |

Brazing material pastes were made by mixing the bonding brazing material components according to the examples and the comparative example with an organic binder. The DSC curve was measured for each brazing material pastes using the DSC.

As the DSC, TGA-DSC simultaneous thermal analysis apparatus STA449-F3-Jupiter manufactured by NETZSCH was used. The measurement was carried out in an Ar flow by dropping an appropriate amount of the brazing material into an alumina container. The measurement was performed with the lid of the alumina container closed. The temperature program consisted of the heating rate of 20° C./min, 950° C.×20 min holding, and the cooling rate of 20° C./min. 15 mg of the solid content of the sample was used.

The existence or absence of the first endothermic peak or the second endothermic peak in the heating process was checked. At the same time, the peak top temperature was measured. The results are shown in Table 3.

TABLE 3

| | DSC curve (peak top temperature ° C.) Heating process | |
|---|---|---|
| | First endothermic peak | Second endothermic peak |
| Example 1 | 585 | 758 |
| Example 2 | 567 | 767 |
| Example 3 | 559 | 772 |
| Example 4 | 572 | 760 |
| Example 5 | 570 | 764 |
| Comparative example 1 | — | 780 |

As the table shows, the bonding brazing materials according to the examples had the first endothermic peak and the second endothermic peak. In contrast, in the comparative example 1, the endothermic peak indicating the decomposition reaction of $TiH_2$ was below 520° C. That is, no first endothermic peak was observed.

Next, a silicon nitride substrate was prepared as the ceramic substrate. The silicon nitride substrate having a thermal conductivity of 90 W/m·K, a three-point bending strength of 600 MPa, and 50 mm long×40 mm wide×0.32 mm thick was used. As the copper plate, the oxygen-free copper plate having 50 mm long×40 mm wide×0.5 mm thick was prepared. The brazing material paste of 30 μm was applied to both surfaces of the ceramic substrate, and the copper plates was respectively placed thereon.

Next, the thermal bonding process was performed. The bonding atmosphere was unified to the nitrogen atmosphere. Also, the bonding conditions were unified to 850° C.×20 minutes. The conditions shown in Table 4 were set for the heating rate and the cooling rate.

TABLE 4

| | Heating rate (° C./min) | Cooling rate (° C./min) | \| heating rate - cooling rate \| (° C./min) |
|---|---|---|---|
| Example 1 | 20 | 20 | 0 |
| Example 2 | 30 | 30 | 0 |
| Example 3 | 50 | 50 | 0 |
| Example 4 | 30 | 45 | 15 |
| Example 5 | 40 | 80 | 40 |
| Comparative example 1 | 20 | 20 | 0 |

A bonded body was manufactured by the above processes. Ten bonded bodies according to each of the examples and the comparative example were manufactured.

Next, the cross-sectional structure of the obtained bonded body was observed. The cross section of the bonded body was observed by SEM-EDX. The measurement area of 20 μm×10 μm in the bonding layer was observed to observe the Ti-rich region and the Ti-poor region. Regarding the cross-sectional structure, arbitrary three areas that do not overlap each other were observed. Regarding the presence or absence of the Ti-rich region or the Ti-poor region, the result in which they were observed at all three areas was described as "yes", and the result in which they were not observed at even one area was described as "no". Also, as the area ratio, the lower limit and upper limit of the measurement results were recorded. For the mass ratio of Cu and Sn, the average value of the ratio of the mass of Cu to the mass of Sn was calculated.

A diffusion region of Sn into the copper plate was also observed. A region where the ratio ($M_{Ti}/M_{Sn}$) of the mass $M_{Ti}$ of Ti to the mass $M_{Sn}$ of Sn was not less than 0.5 was taken as the Ti-rich region. A region where the mass ratio ($M_{Ti}/M_{Sn}$) was not more than 0.1 was taken as the Ti-poor region.

When the bonding layer was divided into two at the center, it was checked whether the mass ratio ($M_{Ti}/M_{Sn}$) in the region on the ceramic substrate side was greater than the mass ratio ($M_{Ti}/M_{Sn}$) in the region on the copper plate side. Also, when surface analysis was performed for the cross section of the bonding layer, it was confirmed whether the mass ratio ($M_{Ti}/M_{Sn}$) was less than 1.

In addition, the position where not less than 1 mass % of Sn was observed in the copper plate was determined as the region where Sn diffused into the copper plate. The results are shown in Table 5 and Table 6.

TABLE 5

| | Bonding layer | | | | | | Copper plate |
|---|---|---|---|---|---|---|---|
| | Ti-rich region | | | Ti-poor region | | | Sn |
| | Presence or not | Area ratio of Ti-rich region (%) | Mass ratio of Cu/Sn | Presence or not | Area ratio of Ti-poor region (%) | Mass ratio of Cu/Sn | diffusion region (μm) |
| Example 1 | Yes | 42~52 | 0.15 | Yes | 8~24 | 4.8 | 46 |
| Example 2 | Yes | 43~57 | 0.22 | Yes | 7~27 | 5.4 | 25 |
| Example 3 | Yes | 48~59 | 0.28 | Yes | 3~18 | 5.8 | 23 |
| Example 4 | Yes | 31~58 | 0.18 | Yes | 5~37 | 5.0 | 32 |
| Example 5 | Yes | 17~51 | 0.19 | Yes | 10~55 | 5.1 | 37 |
| Comparative example 1 | No | — | — | Yes | 100 | 1.4 | 287 |

TABLE 6

| | Mass ratio of Ti/Sn on ceramic substrate side > mass ratio of Ti/Sn on copper plate side? | Mass ratio of Ti/Sn less than 1? |
|---|---|---|
| Example 1 | Yes | Yes |
| Example 2 | Yes | Yes |
| Example 3 | Yes | Yes |
| Example 4 | Yes | Yes |
| Example 5 | Yes | Yes |
| Comparative example 1 | Yes | Yes |

As the tables shows, in the bonded body according to the examples, the Ti-rich region and the Ti-poor region were observed in the bonding layer. Also, the mass ratio ($M_{Ti}/M_{Sn}$) in the Ti-rich region was within the range of not less than 0.5 and not more than 1.2. Also, one or two intermetallic compounds of $Sn_3Ti_5$ and $Sn_5Ti_6$ were detected in the Ti-rich region and the Ti-poor region.

When the bonding layer was observed using the backscattered electron image of SEM, the region that appeared white in the backscattered electron image at high contrast almost matched the Ti-rich region identified from the SEM-EDX analysis results. As for the area ratio of the Ti-rich region, it is found that the investigating method using the SEM backscattered electron image is effective.

The height of the Sn diffusion region into the copper plate was also small, i.e., not more than 100 μm, further not more than 50 μm. It is found that the brazing material having the DSC curve with the predetermined peak at the heating rate and the cooling rate of 20° C./min has the effect of suppressing the diffusion of Sn into the copper plate.

In contrast, no Ti-rich region was observed in the comparative example. Therefore, the height of the Sn diffusion region in the copper plate exceeded 100 μm.

Next, the warp amount of the obtained bonded body and the bonding strength of the copper plate were measured. The warp amount was measured on the long side. When all 10 pieces had a warp amount of not more than 0.3 mm, the pieces were evaluated as best products (⊚). When 1 to 3 pieces had a warp amount exceeding 0.3 mm, the pieces were evaluated as good products (○). When four or more pieces had a warp amount exceeding 0.3 mm, the pieces were evaluated as defective products (x). Further, the peel strength was used as the bonding strength of the copper plate. Specifically, a sample for peel test was prepared in each of the examples and the comparative example. The samples were prepared by bonding a strip-shaped copper plate to the ceramic substrate. At that time, one end of the copper plate was bonded so as to protrude from the ceramic substrate. Peel strength was measured by pulling the protruding copper plate vertically. The results are shown in Table 7.

An example in which the heating rate and the cooling rate of the example 1 are set to 5° C./min was referred to as the reference example 1. An example in which the heating rate and the cooling rate of the comparative example 1 are set to 5° C./min was referred to as the reference example 2.

TABLE 7

|  | Amount of warp | Bonding strength (kN/mm) |
| --- | --- | --- |
| Example 1 | ⊚ | 15 |
| Example 2 | ⊚ | 17 |
| Example 3 | ⊚ | 19 |
| Example 4 | ⊚ | 15 |
| Example 5 | ○ | 15 |
| Comparative example 1 | X | 13 |
| Reference example 1 | ⊚ | 6 |
| Reference example 2 | X | 3 |

As the table shows, the bonded bodies according to the examples were excellent in the warp amount and the bonding strength. On the other hand, in the comparative example 1, because the amount of Ag was large, bonding was not successfully performed when the heating rate and cooling rate were high. Also, regarding an example in which the difference between the heating rate and the cooling rate exceeded 20° C./min like the example 5, deterioration in the warp amount was observed. Therefore, it is found that the difference between the heating rate and the cooling rate is preferably not more than 20° C./min.

In addition, although the warp amount in the reference example 1 was small, the bonding strength was lowered. It is found that the bonding brazing materials of the examples are suitable for the fast-bonding process with the heating rate of not less than 20° C./min. The same applies to the reference example 2 as well. In the nitrogen atmosphere, the bonding brazing material containing a large amount of Ag progressed in nitridation, resulting in a decrease in the bonding strength.

From the above, it is found that, when the brazing material has the DSC curve with the predetermined peak at the heating rate and the cooling rate of 20° C./min, excellent bondability can be obtained even if the heating rate and cooling rate in the bonding process are increased, i.e., not less than 20° C./min. Therefore, it is found that the bonded body according to the embodiment has a small warp amount and is excellent in mass productivity.

While certain embodiments of the invention have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the invention and are within the scope of the inventions described in the claims and their equivalents. Also, the embodiments described above can be implemented in combination with each other.

What is claimed is:

1. A bonded body comprising:
   a ceramic substrate;
   a copper plate; and
   a bonding layer provided on at least one surface of the ceramic substrate and bonding the ceramic substrate and the copper plate,
   the bonding layer containing Cu, Ti, and a first element being one or two selected from Sn and In,
   the bonding layer being free of Ag,
   the bonding layer including
   a Ti-rich region in which a ratio ($M_{Ti}/M_{E1}$) of a mass $M_{Ti}$ of Ti to a mass $M_{E1}$ of the first element being not less than 0.5, and
   a Ti-poor region in which the ratio ($M_{Ti}/M_{E1}$) being not more than 0.1.

2. The bonded body according to claim 1, wherein the ratio ($M_{Ti}/M_{E1}$) in the Ti-rich region is not less than 0.5 and not more than 1.2.

3. The bonded body according to claim 1, wherein a ratio ($M_{Cu}/M_{E1}$) of a mass $M_{Cu}$ of Cu to the mass $M_{E1}$ is not less than 0.05 and not more than 0.4 in the Ti-rich region.

4. The bonded body according to claim 1, wherein a ratio ($M_{Cu}/M_{E1}$) of a mass $M_{Cu}$ of Cu to the mass $M_{E1}$ is not less than 3 and not more than 10 in the Ti-poor region.

5. The bonded body according to claim 1, wherein the first element is Sn, and when the bonding layer is vertically divided into two halves, the ratio ($M_{Ti}/M_{E1}$) in a region on the ceramic substrate side is larger than the ratio ($M_{Ti}/M_{E1}$) in a region on the copper plate side.

6. The bonded body according to claim 1, wherein the first element is Sn, and when surface analysis is performed for a cross section of the bonding layer, the ratio ($M_{Ti}/M_{E1}$) is less than 1.

7. The bonded body according to claim 1, wherein
   the copper plate includes a diffusion region in which an amount of diffusion of the first element from a boundary between the bonding layer and the copper plate is not less than 1 wt %, and
   a length of the diffusion region in a direction connecting the ceramic substrate and the copper plate is not more than 100 μm.

8. The bonded body according to claim 1, wherein
   the copper plate includes a diffusion region in which an amount of diffusion of the first element from a boundary between the bonding layer and the copper plate is not less than 1 wt %, and
   a length of the diffusion region in a direction connecting the ceramic substrate and the copper plate is not more than 50 μm.

9. The bonded body according to claim 1, wherein a thickness of the copper plate is not less than 0.3 mm.

10. The bonded body according to claim 2, wherein a ratio ($M_{Cu}/M_{E1}$) of a mass $M_{Cu}$ of Cu to the mass $M_{E1}$ is not less than 3 and not more than 10 in the Ti-poor region.

11. The bonded body according to claim 2, wherein
the first element is Sn, and
when the bonding layer is vertically divided into two halves, the ratio ($M_{Ti}/M_{E1}$) in a region on the ceramic substrate side is larger than the ratio ($M_{Ti}/M_{E1}$) in a region on the copper plate side.

12. The bonded body according to claim 2, wherein
a ratio ($M_{Cu}/M_{E1}$) of a mass $M_{Cu}$ of Cu to the mass $M_{E1}$ is not less than 3 and not more than 10 in the Ti-poor region,
the first element is Sn, and
when the bonding layer is vertically divided into two halves, the ratio ($M_{Ti}/M_{E1}$) in a region on the ceramic substrate side is larger than the ratio ($M_{Ti}/M_{E1}$) in a region on the copper plate side.

13. The bonded body according to claim 5, wherein
the first element is Sn, and
when surface analysis is performed for a cross section of the bonding layer, the ratio ($M_{Ti}/M_{E1}$) is less than 1.

14. The bonded body according to claim 2, wherein
the copper plate includes a diffusion region in which an amount of diffusion of the first element from a boundary between the bonding layer and the copper plate is not less than 1 wt %,
a length of the diffusion region in a direction connecting the ceramic substrate and the copper plate is not more than 100 μm,
the first element is Sn, and
when the bonding layer is vertically divided into two halves, the ratio ($M_{Ti}/M_{E1}$) in a region on the ceramic substrate side is larger than the ratio ($M_{Ti}/M_{E1}$) in a region on the copper plate side.

15. The bonded body according to claim 5, wherein
the copper plate includes a diffusion region in which an amount of diffusion of the first element from a boundary between the bonding layer and the copper plate is not less than 1 wt %,
a length of the diffusion region in a direction connecting the ceramic substrate and the copper plate is not more than 100 μm,
the first element is Sn, and
when surface analysis is performed for a cross section of the bonding layer, the ratio ($M_{Ti}/M_{E1}$) is less than 1.

16. A circuit board, comprising the bonded body according to claim 1.

17. A semiconductor device, comprising:
the circuit board according to claim 16; and
a semiconductor element mounted on the circuit board.

18. The bonded body according to claim 1, wherein
both the Ti-rich region and the Ti-poor region exist within a measurement area of 20 μm×10 μm in a cross-section of the bonding layer, and
the cross-section is parallel to a direction perpendicular to a surface of the ceramic substrate.

19. The bonded body according to claim 13, wherein
both the Ti-rich region and the Ti-poor region exist within a measurement area of 20 μm×10 μm in a cross-section of the bonding layer, and
the cross-section is parallel to a direction perpendicular to a surface of the ceramic substrate.

20. A method for manufacturing the bonded body according to claim 1, comprising bonding the ceramic substrate and the copper plate using a bonding brazing material,
the bonding brazing material having an endothermic peak between not less than 520° C. and not more than 590° C. in DSC curve of a heating process when the DSC curve is measured at a heating rate of 20° C./min.

* * * * *